United States Patent
Oeuvrard et al.

(10) Patent No.: US 9,767,942 B2
(45) Date of Patent: Sep. 19, 2017

(54) VEHICLE TRIM ELEMENT

(71) Applicant: Faurecia Interieur Industrie, Nanterre (FR)

(72) Inventors: Jean Oeuvrard, Pontoise (FR); Godefroy Beau, Colombes (FR)

(73) Assignee: Faurecia Interieur Industrie, Nanterre (FR)

( * ) Notice: Subject to any disclaimer, the term of this patent is extended or adjusted under 35 U.S.C. 154(b) by 0 days.

(21) Appl. No.: 14/670,406

(22) Filed: Mar. 27, 2015

(65) Prior Publication Data

US 2015/0279523 A1 Oct. 1, 2015

(30) Foreign Application Priority Data

Mar. 28, 2014 (FR) ..................................... 14 52762

(51) Int. Cl.
*H01H 1/02* (2006.01)
*H01C 10/12* (2006.01)
(Continued)

(52) U.S. Cl.
CPC .............. *H01C 10/12* (2013.01); *B60K 37/00* (2013.01); *B60K 37/06* (2013.01); *B60Q 3/54* (2017.02);
(Continued)

(58) Field of Classification Search
CPC ............ H01H 1/02; H01H 9/26; H01H 13/70; H01H 13/72; H01H 13/76; H01H 13/84; H01H 859/00; H01H 3/12; H01H 3/48; H01H 1/06; H01H 1/60; H01H 2227/032; H01H 2227/034; H01H 35/00; H01H 35/2614; H01H 35/2621; H01H 35/2628;
(Continued)

(56) References Cited

U.S. PATENT DOCUMENTS 5,434,566 A * 7/1995 Iwasa ..................... H01H 13/84
341/34
5,448,028 A 9/1995 Filion et al.
(Continued)

FOREIGN PATENT DOCUMENTS

DE 102009036212 B3 2/2011
EP 0564066 A1 1/1993
(Continued)

OTHER PUBLICATIONS

French Search Report for priority document No. FR 1452762, dated Jan. 15, 2015, 4 pages.
(Continued)

*Primary Examiner* — Anthony R. Jimenez
(74) *Attorney, Agent, or Firm* — Reising Ethington P.C.

(57) ABSTRACT

A vehicle trim element that includes at least one supporting layer having an internal face and an external face, and a skin having an internal face and an external face. The internal face of the skin covers the external face of the supporting layer in at least one detection area. The supporting layer has a through-orifice extending from the internal face to the external face of the supporting layer. At least one detection element is located in the through-orifice. The detection element is in constant contact with the portion of the internal face of the skin covering the through-orifice of the supporting layer.

12 Claims, 1 Drawing Sheet

(51) Int. Cl.
*B60R 13/02* (2006.01)
*B60K 37/00* (2006.01)
*B60K 37/06* (2006.01)
*H03K 17/96* (2006.01)
*B60Q 3/54* (2017.01)
*H01H 9/18* (2006.01)

(52) U.S. Cl.
CPC ......... *B60R 13/02* (2013.01); *H03K 17/9625* (2013.01); *B60K 2350/00* (2013.01); *B60K 2350/1024* (2013.01); *B60K 2350/2043* (2013.01); *B60Q 2500/10* (2013.01); *B60R 2013/0281* (2013.01); *B60R 2013/0287* (2013.01); *H01H 9/182* (2013.01); *H03K 2217/96015* (2013.01); *H03K 2217/96042* (2013.01)

(58) Field of Classification Search
CPC ......... H01H 35/2685; H01H 2211/032; H01H 13/85; H01H 9/00; H03K 2217/96015; H03K 2217/96042
USPC .... 200/511, 181, 510, 520, 293, 293.1, 294, 200/302.1, 303, 332.1, 341, 5 A, 333
See application file for complete search history.

(56) References Cited

U.S. PATENT DOCUMENTS

| | | | | |
|---|---|---|---|---|
| 6,809,280 | B2* | 10/2004 | Divigalpitiya | H01H 1/029 200/5 A |
| 7,151,528 | B2* | 12/2006 | Taylor | G06F 3/0414 200/5 A |
| 2007/0056385 | A1* | 3/2007 | Lorenz | H01H 13/702 73/818 |
| 2009/0058118 | A1* | 3/2009 | Hein | B60K 35/00 296/1.08 |
| 2013/0068601 | A1* | 3/2013 | Sellers | G06F 3/0202 200/5 A |

FOREIGN PATENT DOCUMENTS

| | | | | |
|---|---|---|---|---|
| FR | 2937932 | A1 | 5/2010 | |
| JP | H10296757 | A | 11/1998 | |
| WO | 9711473 | A1 | 3/1997 | |
| WO | 0208017 | A2 | 1/2002 | |
| WO | WO 0208017 | A2 * | 1/2002 | ......... B60R 13/0243 |
| WO | 2006131462 | A1 | 12/2006 | |

OTHER PUBLICATIONS

French Written Opinion for priority document No. FR 1452762, dated Jan. 15, 2015, 4 pages.

* cited by examiner

_US 9,767,942 B2_

VEHICLE TRIM ELEMENT

TECHNICAL FIELD

The present invention relates to a vehicle trim element comprising:
- at least one supporting layer, comprising an internal face and an external face,
- a skin, comprising an internal face and an external face, the internal face of the skin covering the external face of the supporting layer,
- at least one detection area, where the supporting layer comprises a through-orifice extending from the internal face to the external face of the supporting layer, and
- at least one detection element placed in the through-orifice.

BACKGROUND

Providing trim elements is known, allowing display of pictograms directly on the skin of these elements, the pictograms indicating certain functions or certain states of the vehicle. By pictogram is meant any figurative or symbolic drawing used for communication purposes, including alphanumeric characters.

Providing control members on the trim elements is also known. FR 2 838 558 A1 for example describes a control member provided with a tactile sensor. However, in this control member, touching of the skin by the user does not instantaneously induce detection by the sensor. The reaction to the control may be perceived as slow by the user. Further, in the detection area, the skin is not supported. Therefore, a too strong pressure exerted on the latter to trigger detection may cause degradation of the skin.

SUMMARY

One of the objects of the invention is to provide a more robust trim element and with better sensitivity of tactile detection.

For this purpose, there is provided a vehicle trim element wherein the detection element is placed in constant contact with the portion of the internal face of the skin covering the through-orifice of the supporting layer.

By providing constant contact between the skin and the detector on the detection area, the detection capability of the sensor is improved. Indeed, as soon as the user presses on the skin, the detector may activate a control signal. The reaction to the action of the user is therefore faster than when there is a space between the skin and the detector.

The element according to the invention may comprise one or more of the following features taken individually or according to all the technically possible combinations:
- the detection area is deformable between an active position, wherein at least one portion of the skin covering the through-orifice extends inside the through-orifice, and an inactive position, wherein the skin is outside the through-orifice, the detection element being in constant contact with the portion of the internal face of the skin covering the through-orifice, in the active position and in the inactive position;
- the skin is flexible;
- the trim element comprises a light source positioned facing the through-orifice of the supporting layer on the side of the internal face of the supporting layer, the skin and the detection element being translucent;
- the trim element comprises an ink layer applied on the internal face of the skin, the ink layer comprising at least one aperture defining a pictogram facing the through-orifice;
- the detection element comprises an external face and an internal face, the external face being in contact with the portion of the internal face of the skin covering the through-orifice of the supporting layer, and a flexible element being placed on the internal face of the detection element;
- the flexible element is a translucent foam;
- the flexible element bears against a rigid supporting element;
- the detection element is a resistive sensor;
- the supporting layer is opaque.

BRIEF DESCRIPTION OF THE DRAWINGS

Other aspects and advantages of the invention will become apparent upon reading the description which follow, only given as an example, and made with reference to the appended drawings, wherein.

DESCRIPTION OF THE ILLUSTRATED EMBODIMENT

Figure 1:
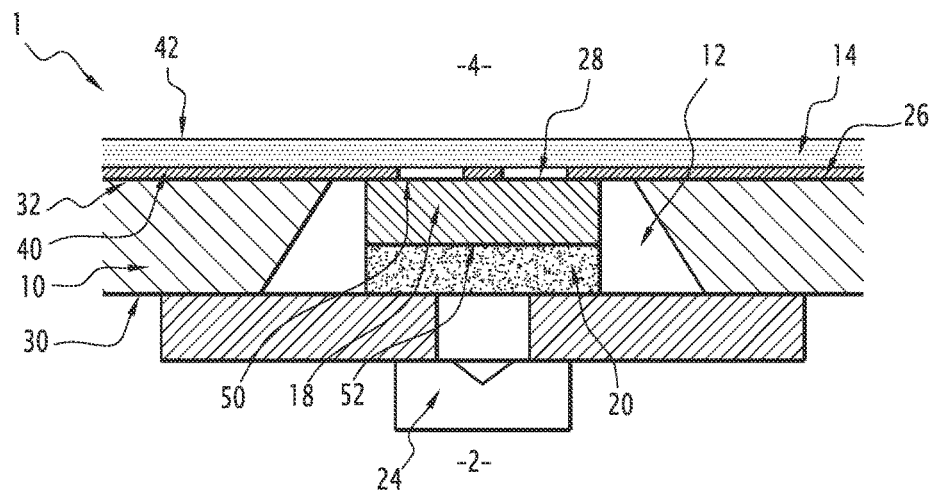
FIG. 1 is a sectional view of a trim element according to the invention when the detection area is in an inactive position.
Figure 2:
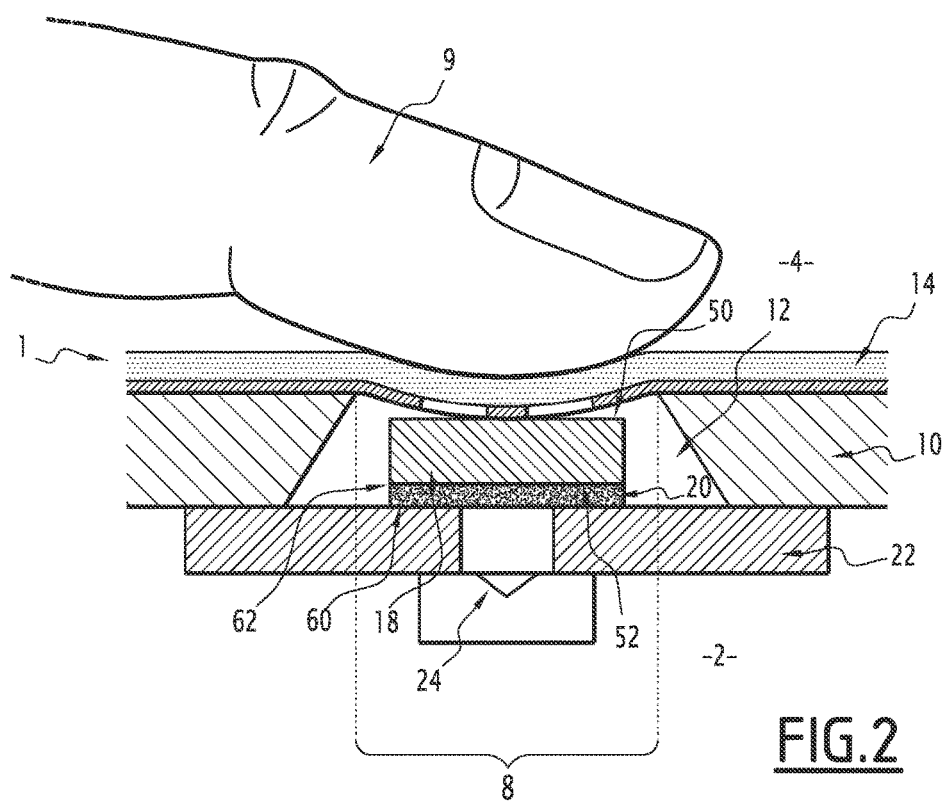
FIG. 2 is a similar view to FIG. 1 of the trim element of FIG. 1 when the detection area is in an active position.

FIGS. 1 and 2 illustrate a trim element positioned in a vehicle so as to hide a portion of the body 2 of a vehicle and to show a visible and accessible portion from the passenger compartment 4 of the vehicle.

In the description, by "external", is meant that it is turned towards the passenger compartment 4 of the vehicle and by "internal" is meant that it is turned towards the body 2 of the vehicle.

According to the invention, the trim element 1 allows a user to control at least one function of the vehicle by means of a detection area 8 which is deformable between an inactive position illustrated in FIG. 1 and an active position illustrated in FIG. 2. The detection area 8 is for example of a dimension corresponding to the dimension of a control button, for example adapted to the size of a finger 9 of the user.

In the illustrated example, the trim element 1 further provides information as to the controlled functions to the user by means of backlighting as this will be described later on.

The trim element 1 comprises at least one supporting layer 10 delimiting a through-orifice 12, a skin 14 positioned on the supporting layer on the side of the passenger compartment 4 and a detection element 18 placed in the through-orifice 12 such that the detection element 18 is in constant contact with the portion of the skin 14 covering the through-orifice 12 of the supporting layer 10.

The trim element 1 further comprises a flexible element 20, a rigid supporting element 22, a light source 24. Further the skin 14 comprises an ink layer 26 including an area defining at least one pictogram 28.

The supporting layer 10 comprises an internal face 30 and an external face 32.

The supporting layer 10 is substantially rigid. Further the supporting layer 10 is substantially opaque, i.e. it does not let through or only slightly transmits light between its internal face 30 and its external face 32.

The supporting layer 10 is for example made from plastic material. The plastic material is typically a thermoplastic material of the type: polyester, homopolymer or copolymer, or polyolefin, homopolymer or copolymer, or acrylonitrile-butadiene-styrene (ABS), or polyamide (PA), or polycarbonate (PC), or polymethyl methacrylate (PMMA), or further any combination of at least two of these materials. These materials have rigidity allowing them to fulfill a supporting function.

The through-orifice 12 is located in the detection area 8. By a through-orifice is meant that the orifice extends from the internal face 30 to the external face 32 of the supporting layer 10 and opens into these faces 30, 32. The detection area 8 is substantially defined by the whole portion of the trim element 1 facing the through-orifice 12. The through-orifice 12 has in the example illustrated in the figures a truncated cone shape. The external portion of the through-orifice 12 extending in the external face 32 has a diameter smaller than the internal portion of the through-orifice 12 extending in the internal face 30. This shape allows concentration of the light of the source 24 towards the pictogram area as this will be described later on. Alternatively, the through-orifice 12 has a straight or other cylindrical shape.

The skin 14 comprises an internal face 40 and an external face 42. The internal face 40 of the skin 14 covers the external face 32 of the supporting layer 10. The skin 14 is for example attached to the support by means of an adhesive.

The skin 14 is flexible. By flexible is meant that the skin 14 is able to be deformed between an active position illustrated in FIG. 2 and an inactive position illustrated in FIG. 1. In the active position of the skin 14, a portion of the skin 14 enters the through-orifice 12 at the detection area 8.

Further, the skin 14 is elastic and the inactive position of the skin 14 corresponds to its condition at rest. That is to say that the skin 14 is able to return from the active position to the inactive position when it is not urged.

In the embodiment illustrated here, the skin 14 is translucent. Thus a portion of the light emitted by the light source 24 is transmitted through the skin 14 into the passenger compartment 4. On the other hand, the interior of the trim element 1 is invisible from the passenger compartment 4, notably because of the opacity of the supporting layer 10.

The external face 42 of the skin 14 is for example substantially planar. In an embodiment not shown, the external face 42 of the skin 14 has protruding or recessed areas for example for signaling the presence of the detection area 8, and of the function control buttons of the vehicle.

The external face 42 of the skin 14 is intended to be visible from the passenger compartment 4. The material of the external face 42 of the skin 14 is advantageously pleasant to the touch. Thus, the skin 14 is grained or smooth.

The skin 14 is for example made in polymer, for example a polymethyl methacrylate, in polycarbonate or other. The thickness of the skin 14 is advantageously comprised between 0.1 mm and 1 mm.

The detection element 18 is placed in the through-orifice 12 of the supporting layer 10. The detection element 18 comprises an external face 50 and an internal face 52. The external face 50 of the detection element is in contact with the portion of the internal face 40 of the skin 14 covering the through-orifice 12.

The contact between the detection element 18 and the portion of the internal face 40 of the skin 14 is a constant contact, i.e. contact is constant regardless of the position of the skin. Whether the skin 14 is in its active position illustrated in FIG. 2, in its inactive position illustrated in FIG. 1 or in other intermediate positions, the detection element 18 and the portion of the internal face 40 of the skin are always in contact.

According to an embodiment, the detection element 18 is not attached to the skin 14, meaning that the skin 14 is simply applied against the detection element 18 and can be deformed without deforming the detection element 18, as shown in FIG. 2.

The detection element 18 for example comprises a resistive sensor. The detection element 18 is able to measure a pressure difference, to generate a control signal depending on this measurement and to transmit it to a control member. In particular, the sensor detects pressure exerted by the finger 9 of the user. The force exerted by the finger 9 of the user is advantageously comprised between 2 N and 20 N.

The detection element 18 is translucent, i.e. it lets through light like the skin 14.

The flexible element 20 is positioned on the internal face 52 of the detection element 18. The flexible elements 20 include an internal face 60 and an external face 62, the external face 62 of the flexible element being in contact with the detection element 18.

The flexible element 20 is able to be deformed between a compressed state and an extended state. The thickness of the flexible element 20 in the extended state, illustrated in FIG. 1, is advantageously comprised between 0.2 mm and 2 mm. The deformation of the flexible element 20 upon passing from its extended state to its compressed state is a 50% reduction of its initial thickness.

Further, the flexible element 20 is elastic and the extended state corresponds to the rest position of the flexible element 20. That is to say that the flexible element 20 is able to return from the compressed state to the extended state when it is not urged.

In the example, the flexible element 20 is a translucent foam. For example, the flexible element 20 is in a cross-linked polypropylene foam.

The flexible element 20 gives the possibility of imparting a flexible touch to the trim element facing the detection element 18. This flexible element 20 provides comfortable use. Further, it assists return of the detection element 18 and of the skin 14 towards the inactive position when the skin 14 is not urged.

The internal face 60 of the flexible element 20 bears against the rigid supporting element 22. The rigid supporting element 22 is intended to block the displacement of the flexible element 20, when the finger 9 of the user presses on the skin 14 in the detection area 8. Thus, upon passing from the detection area 8 of the inactive position to the active position, the flexible element 20 is deformed and is squeezed between the detection element 18 and the rigid supporting element 22.

The rigid supporting element 22 is for example opaque and delimits a hole in the detection area 8. The hole of the rigid supporting element 22 crosses the rigid supporting element 22 from the external face towards the internal face of the rigid supporting element 22. The hole is located facing the light source 24. The diameter of the hole of the rigid supporting element 22 is less than the diameter of the through-orifice 12.

The light source 24 is positioned on the internal side of the trim element 1 facing the detection area 8 and the area of the ink layer 26 forming the pictogram 28.

The light source 24 is for example positioned on the external portion of the rigid supporting element 22. The light source 24 is for example a light box positioned in the through-orifice 12. The light source 24 for example comprises a light-emitting diode.

The ink layer 26 is applied on the skin 14.

For example, the skin comprises the ink layer 26 on its internal face 40. Alternatively, the ink layer 26 is applied on the external face 42 of the skin 14 or directly in the skin 14. The ink layer 26 could also be applied on both the internal face 40 and the external face 42. The ink layer 26 forms a mask positioned in the path of the light between the light source 24 and the passenger compartment 4. The ink layer 26 comprises apertures letting through the light and areas blocking the passage of the light so as to form the pictogram 28 allowing display of back-lighted information on the external face 42 of the translucent skin 14. Alternatively, the mask is formed in a thin, flexible and opaque film extending between the skin 14 and the light source 24.

Thus, the pictogram 28 is back-lighted. By back-lighted is meant that the light from the light source 24 crosses the flexible element 20, the detection element 18, and the mask and reaches the pictogram 28 of the translucent skin 14 from underneath, so as to display the pictogram on the external face 42 of the skin 14.

The use of the trim element 1 will now be described.

The light source 24 illuminates the pictogram 28 of the trim element 1. The user thus accesses information from the vehicle. The pieces of information for example relate to the position, the function of the control buttons as well as the status of the control function. The through-orifice 12 and the translucence of the flexible element 20, of the detection element 18, of the skin 14 and of the transparent portions of the pictogram 28 allow illumination of the pictogram area. Further as the supporting layer 10 is opaque, loss of light is limited, since the light of the source 14 does not scatter in the layer of the support 10.

When the user wishes to activate the control, he/she applies his/her finger 9 on the detection area 8. The contact of the finger 9 with the skin 14 allows deformation of the skin 14 from the inactive position illustrated in FIG. 1 to the active position illustrated in FIG. 2. The pressure exerted on the skin 14 is transmitted to the detection element 18 which is in contact with the skin 14. The detection element 18 then measures a pressure difference and generates a control signal transmitted to the device to be controlled. The control signal for example depends on the pressure force exerted by the finger 9 of the user and on the position of the finger 9 on the sensor.

On the other hand, the detection element 18 moves under the effect of the pressure from the finger 9. The flexible element 20, is located between the immobile rigid supporting element 22 and the moving detection element deforms towards the compressed state. The user thus has a sensation of pressing on a control button, since the skin 14 in contact with his/her finger 9 deforms. On the other hand, the user has a sensation of abutment of the button by the compressibility limit of the flexible element 20 and by the presence of the immobile rigid supporting element 22.

When the user releases the pressure from his/her finger 9, the detection area 8 returns to its inactive state because of the elasticity of the skin 14 and of the elasticity of the flexible element 20. The detection element remains permanently in contact with the skin 14. Thus, the detection element 18 is able to sense low pressures from the finger 9 of the user on the skin 14 in the detection area 8.

The trim element 1 according to invention therefore has good sensitivity of tactile detection. Further, the skin 14 is always supported either by the supporting layer 10 outside the detection area 8, or by the detection element 18 in the detection area. The skin 14 is thus not very fragile.

Alternatively, the trim element 1 does not include any flexible elements layers 20 at the rear of the sensor and the detection element 18 is itself flexible.

Alternatively, the detection element 18 is attached to the skin 14.

The invention claimed is:

1. A vehicle trim element comprising:
   at least one supporting layer, comprising an internal face and an external face, and
   a skin, comprising an internal face and an external face, the internal face of the skin covering the external face of the supporting layer,
   at least one detection area, wherein the supporting layer comprises a through-orifice extending from the internal face to the external face of the supporting layer, and
   at least one detection element placed in the through-orifice,
   wherein the detection element is placed in constant contact with a portion of the internal face of the skin covering the through-orifice of the supporting layer;
   wherein the detection element comprises an external face and an internal face, the external face of the detection element being in contact with the portion of the internal face of the skin covering the through-orifice of the supporting layer, and a flexible element being placed in contact with the internal face of the detection element, the flexible element positioned under the detection element; and
   wherein the internal face of the detection element is opposite to the external face of the detection element.

2. The trim element according to claim 1, wherein the detection area is deformable between an active position, in which at least one portion of the skin covering the through-orifice extends inside the through-orifice and an inactive position, in which the skin is outside the through-orifice, the detection element being in constant contact with the portion of the internal face of the skin covering the through-orifice, in the active position and in the inactive position.

3. The trim element according to claim 1, wherein the skin is flexible.

4. The trim element according to claim 1, wherein the trim element comprises a light source positioned facing the through-orifice of the supporting layer on the side of the internal face of the supporting layer, the skin and the detection element being translucent.

5. The trim element according to claim 1, wherein the trim element comprises an ink layer applied on the internal face of the skin, the ink layer comprising at least one aperture defining a pictogram facing the through-orifice.

6. The trim element according to claim 1, wherein the flexible element is a translucent foam.

7. The trim element according to claim 1, wherein the flexible element bears against a rigid supporting element.

8. The trim element according to claim 1, wherein the detection element is a resistive sensor.

9. The trim element according to claim 1, wherein the supporting layer is opaque.

10. The trim element according to claim 1, wherein the detection element is not attached to the skin.

11. The trim element according to claim 1, wherein the flexible element is in constant contact with the internal face of the detection element in the active position and in the inactive position.

12. A vehicle trim element comprising:
at least one supporting layer, comprising an internal face and an external face, and
a skin, comprising an internal face and an external face, the internal face of the skin covering the external face of the supporting layer,
at least one detection area, wherein the supporting layer comprises a through-orifice extending from the internal face to the external face of the supporting layer, and
at least one detection element placed in the through-orifice,
wherein the detection element is placed in constant contact with a portion of the internal face of the skin covering the through-orifice of the supporting layer;
wherein the detection element comprises an external face and an internal face, the external face of the detection element being in contact with the portion of the internal face of the skin covering the through-orifice of the supporting layer, and a flexible element being placed in contact with the internal face of the detection element;
wherein the internal face of the detection element is opposite to the external face of the detection element; and
wherein the detection element is not attached to the skin.

* * * * *